United States Patent [19]
Wakabayashi

[11] Patent Number: 5,691,214
[45] Date of Patent: Nov. 25, 1997

[54] METHOD OF MANUFACTURING SEMICONDUCTOR DEVICES

[75] Inventor: Masaru Wakabayashi, Tokyo, Japan

[73] Assignee: NEC Corporation, Tokyo, Japan

[21] Appl. No.: 725,760

[22] Filed: Oct. 4, 1996

[30] Foreign Application Priority Data

Oct. 5, 1995 [JP] Japan .................................. 7-258931

[51] Int. Cl.$^6$ .................................................. H01L 21/265
[52] U.S. Cl. .......................... 437/31; 437/47; 437/60;
437/918; 437/979; 437/28; 148/DIG. 136;
148/DIG. 163
[58] Field of Search ........................ 437/47, 60, 154,
437/28, 918, 979; 148/DIG. 136, DIG. 163

[56] References Cited

U.S. PATENT DOCUMENTS

| | | | |
|---|---|---|---|
| 4,418,469 | 12/1983 | Fujita | 437/60 |
| 4,826,780 | 5/1989 | Takemoto et al. | 437/60 |
| 4,898,837 | 2/1990 | Takeda et al. | 437/47 |
| 5,284,794 | 2/1994 | Isobe et al. | 148/DIG. 136 |

FOREIGN PATENT DOCUMENTS 0031978 3/1978 Japan ..................................... 437/28

OTHER PUBLICATIONS

Ultraspeed Digital Devices, Series 1, 'Ultraspeed Bipolar Devices,' Para. 4.4.1, pp. 90–91, published by Baifukan.

*Primary Examiner*—Tuan H. Nguyen
*Attorney, Agent, or Firm*—Sughrue, Mion, Zinn, Macpeak & Seas, PLLC

[57] ABSTRACT

A method of manufacturing a semiconductor device furnished on a silicon substrate with a bipolar element part and a resistance element part formed of an impurity diffusion layer, having (a) a step of forming a first oxide film on said silicon substrate and on the component elements formed on said substrate throughout the entire surface thereof, (b) a step of selectively and sequentially removing the part of said first oxide film corresponding to the base region of said bipolar element part and the surface of said silicon substrate directly underlying said first oxide film and, at the same time, cleaning the freshly exposed surface, (c) a step of forming a second oxide film on said silicon substrate and said component elements formed thereon throughout the entire surface thereof thereby differentiating the thickness of the oxide film formed on said base region and the thickness of the oxide film formed on said resistance element part, and (d) a step of selectively and instantaneously implanting an ion into said bipolar element part and said resistance element part.

4 Claims, 5 Drawing Sheets

METHOD OF MANUFACTURING SEMICONDUCTOR DEVICES

BACKGROUND OF THE INVENTION

1. Field of the Invention

This invention relates to a method of manufacturing a semiconductor device formed of an integrated circuit possessed of a bipolar element and a resistance element or a bi-CMOS (complementary MOS) integrated circuit having a bipolar element and a MOS element incorporated in a mixed state therein.

2. Description of the Prior Art

The conventional circuits possessed of a bipolar element have necessitated a resistance element of high accuracy, which is generally formed simultaneously with a base diffusion layer of the bipolar element. The technique concerning this configuration is disclosed, for example, in "Ultraspeed Digital Devices, Series 1, 'Ultraspeed Bipolar Devices,' Para. 4.4.1, pp 90–91, published by Baifukan."

Figure 1A:
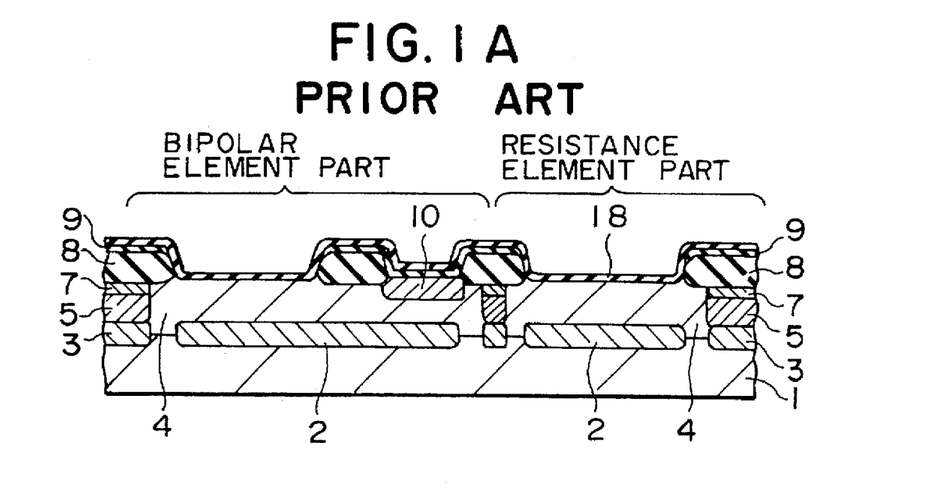
FIGS. 1A to 1C are cross sections of a semiconductor device illustrating sequentially the component steps of the conventional process of manufacturing.
Figure 1B:
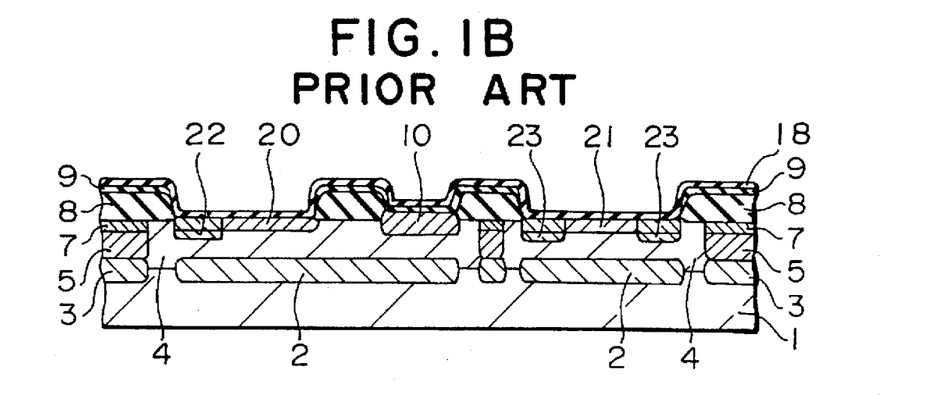
Figure 1C:
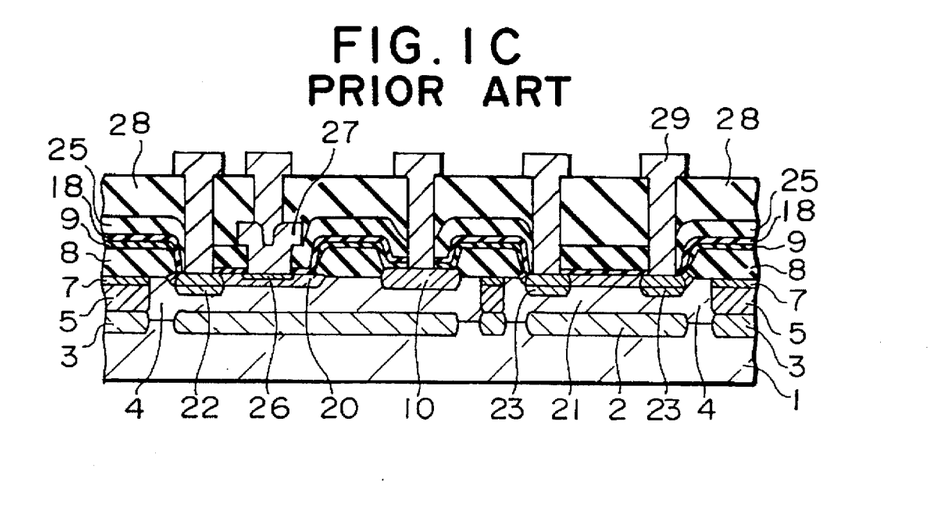

The method of manufacturing the conventional semiconductor device formed of an integrated circuit possessed of a bipolar element and a resistance element will be described below with reference to FIGS. 1A to 1C. An N+ type embedded layer 2 and a P+ type embedded layer 3 are severally formed on a P type silicon substrate 1 and an N type epitaxial layer 4 is grown thereon in a thickness in the approximate range of 1.0–3.0 μm. Then, a P type well 5 is formed for the isolation of an element and a P type channel stopper 7 and a field oxide film 8 are formed by the selective oxidizing method. In an atmosphere of oxygen at a temperature in the approximate range of 900°–1000° C., an oxide film 9 is formed in a thickness of about 200 Å and an N+ type collector diffusion layer 10 is formed by injecting phosphorus in an amount in the approximate range of $1-2\times1^{16}$ cm$^{-2}$ [FIG. 1A].

Then, the silicon surface of the N type epitaxial layer 4 in the bipolar element part and the resistance element part is subjected to a chemical dry etching with a gas such as CF$_4$, etc., selectively in a depth in the approximate range of 0.01–0.02 μm. The reason for the chemical dry etching is that a metal polluted layer, a damage layer caused by ion implantation and reactive ion etching, or an impurity deposited layer, when caused to exist on the surface of the base, will cause recombination of electrons and induce a decline in the current amplification factor of the bipolar element. An oxide film 18 is grown at a temperature in the approximate range of 900°–1000° C. in a height of about 200 Å, a base diffusion layer 20 and a resistance diffusion layer 21 are formed by doping boron by ion implantation consecutively into the bipolar element part and the resistance element part in an amount in the approximate range of $5\times10^{12}-5\times10^{13}$ cm$^{-2}$, and a graft base diffusion layer 22 and a P+ diffusion layer 23 are formed by further doping boron in an amount in the approximate range of $3-5\times10^{15}$ cm$^{-2}$ [FIG. 1B].

Then, an insulating film 25 is grown by the CVD method in a thickness in the approximate range of 2000–3000 Å, an emitter diffusion layer 26 is formed by opening an emitter part, growing an emitter polycrystalline silicon by the CVD method in a thickness in the approximate range of 200–300 Å, ion injecting arsenic in an amount in the approximate range of $1-2\times10^{16}$ cm$^{-2}$, and causing the injected arsenic to be diffused as far as the N type epitaxial layer 4 by a heat treatment in an atmosphere of nitrogen at a temperature in the approximate range of 900°–950° C. for a period in the approximate range of 10–20 minutes, and an emitter electrode 27 is formed by the lithographic method.

2

Subsequently, an interlayer film 18 and an aluminum electrode 29 are formed by a standard procedure to complete the semiconductor device [FIG. 1C].

This conventional method is at a disadvantage in being unable to form simultaneously the base diffusion layer of the bipolar element and the diffusion layer of the resistance element. The reason for this inability is as follows.

The unit length of the resistance element and the magnitude of resistance per surface area are uniquely set by the concentration of the base diffusion layer, whereas the ratio of current amplification of the bipolar element is set by the correlation between the concentration of the base diffusion layer and the concentration of the emitter diffusion layer. Incidentally, while the polycrystalline silicon destined to form the emitter electrode is being grown by the conventional low-pressure CVD method, the entrainment of ambient oxygen owing to the reduced pressure results in the formation of an oxide film in the opening part of the emitter, namely on the interface between the emitter and the base. This oxide film is removed by the reduction with hydrogen during the course of the growth. Because recent trend of the semiconductor devices toward a higher operational speed and a higher degree of integration compels the design size of the emitter in the bipolar element to be reduced to the level of about 0.8 μm, the effect of the reduction with hydrogen is lowered and the oxide film survives in large thickness as compared with the conventionally obtained thickness because the aspect ratio of the opening part of the emitter is inevitably large. It is known that if this thick oxide film persists, the ratio of current amplification will be increased because the oxide film functions to trap the positive hole and consequently to enhance the efficiency of injection of the base.

By the conventional technique, therefore, it is extremely difficult to control the thickness of the oxide film to be formed in the interface between the emitter and the base. For the sake of preventing the ratio of current amplification, a method which attains the adjustment of the thickness of the oxide film by increasing the concentration of the base diffusion layer has been available. When the base diffusion layer of the bipolar element and the diffusion layer of the resistance element are to be formed simultaneously, however, the inevitable increase of the concentration of the diffusion layer of the resistance element concurrently causes a decrease in the magnitude of resistance. When the resistance element is formed in a smaller width or in a larger length than conventionally usual in the expectation of a decrease in the magnitude of resistance, the decreased width lowers the absolute accuracy of the magnitude of resistance or the increased length prevents the element from being amply miniaturized.

SUMMARY OF THE INVENTION

The present invention has been made produced for the purpose of solving the problems incurred by the prior art as mentioned above, and has an object of providing a method of manufacturing a semiconductor device possessing the ability to optimize simultaneously the characteristics of a bipolar element and the characteristics of a resistance element and enjoying high performance, high integration, and high reliability.

To fulfill the object mentioned above, according to a first aspect of this invention, there is provided a method of manufacturing of a semiconductor device furnished on a silicon substrate with a bipolar element part and a resistance element part formed of an impurity diffusion layer, comprising the steps of (a) forming a first oxide film on the silicon substrate and on the component elements formed on the substrate throughout the entire surface thereof, (b) selectively and sequentially removing the part of the first oxide film corresponding to the base region of the bipolar element part and the surface of the silicon substrate directly underlying the first oxide film and, at the same time, cleaning the freshly exposed surface, (c) a second oxide film on the silicon substrate and the component elements formed thereon throughout the entire surface thereof thereby differentiating the thickness of the oxide film formed on the base region and the thickness of the oxide film formed on the resistance element part, and (d) selectively and instantaneously implanting ion into the bipolar element part and the resistance element part.

According to a second aspect of the present invention, there is provided consists in a method of manufacturing a semiconductor device, which further comprises between the steps (a) and (b) mentioned above a step of implanting ion into the collector region of the bipolar element part through the first oxide film as a mask, and a step of wholly removing the first oxide film.

According to a third aspect of the present invention, there is provided in a method of manufacturing a semiconductor device furnished on a silicon substrate with a bipolar element part and a resistance element part formed of an impurity diffusion layer, comprising the steps of (a) forming a first oxide film on the silicon substrate and on the component elements formed on the substrate throughout the entire surface thereof, (b) implanting ion into the collector region of the bipolar element part through the first oxide film as a mask, (c) selectively and sequentially removing the part of the first oxide film corresponding to the base region of the bipolar element part and the surface of the silicon substrate directly underlying the first oxide film and, at the same time, cleaning the freshly exposed surface, (d) forming a second oxide film on the silicon substrate and the component elements formed thereon throughout the entire surface thereof thereby differentiating the thickness of the oxide film formed on the base region and the thickness of the oxide film formed on the resistance element part, and (e) implanting ion selectively and instantaneously into the bipolar element part and the resistance element part.

According to a fourth aspect of the present invention, there is provided a method of manufacturing a semiconductor device furnished on a silicon substrate with a bipolar element part, a resistance element part formed of an impurity diffusion layer, and a MOS element part, comprising the steps of (a) forming a first oxide film on the silicon substrate and on the component elements formed on the substrate throughout the entire surface thereof, (b) implanting ion into the collector region of the bipolar element part through the first oxide film as a mask, (c) wholly removing the first oxide film, (d) a step of sequentially forming a gate oxide film and a gate electrode on the MOS element part mentioned above, (e) a step of forming a second oxide film on the silicon substrate and on the component elements formed thereon throughout the entire surface thereof, (f) selectively and sequentially removing the part of the second oxide film corresponding to the base region of the bipolar element part and the surface of the silicon substrate directly underlying the first oxide film and, at the same time, cleaning the freshly exposed surface, (g) forming a third oxide film on the silicon substrate and on the component elements formed thereon throughout the entire surface thereof thereby differentiating the thickness of the oxide film formed on the base region and the thickness of the oxide film formed on the resistance element part, and (h) implanting ions selectively and instantaneously into the bipolar element part and the resistance element part.

According to the first aspect mentioned above, the bipolar element can be prevented from increasing the ratio of current amplification and, at the same time, the magnitude of resistance of high accuracy can be realized because the ion implantation is effected instantaneously by differentiating the thickness of the oxide film destined to form the base region and the thickness of the oxide film destined to the resistance region. Thus, it allows the semiconductor device to be manufactured in a high yield because the manufacturing is accomplished without adding to the number of photoresist masks or increasing cost.

According to the second aspect, the crystal defects due to the ion implantation can be diminished and the yield can be increased by a margin in the approximate range of 5–10% because the thickness of the oxide film which serves as the mask for the injection of phosphorus into the collector region can be set freely so as to be greater than the thickness used in the first embodiment.

According to the third aspect, the collector resistance (rsc) can be lowered, the base width can be decreased, and the performance of the bipolar element can be improved because the base diffusion layer is allowed to be formed after the formation of the N+ type diffusion layer which serves as a collector drawer part for the bipolar element.

According to the fourth aspect, the decrease of the thickness of the gate oxide film for the miniaturization of the MOS element can be easily attained because the first oxide film is wholly removed. As the mask for the ion implantation into the source and the drain region of the MOS element, the same mask that is used for doping boron into the resistance element part can be used.

The fourth aspect permits the performance of the bipolar element to be further improved because the collector resistance (rsc) can be decreased to about ½ of that of the third aspect by causing the implantation of arsenic for the formation of the N+ diffusion layer 24 which serves as the source and the drain region of the N type channel MOS element part to be simultaneously carried out as a compensation on the N+ type collector diffusion layer 10 which serves as a collector drawer part.

According to the present invention, the method of manufacturing a semiconductor device which comprises the step of first subjecting the base region to a chemical surface treatment and then cleaning the newly exposed surface permits the semiconductor device to be manufactured in a high yield without adding to the number of masks or increasing the cost because the bipolar element and the resistance element can be optimized at the same time. Further, the current amplification ratio of the bipolar element and the resistance magnitude of the resistance element can be independently set because they are not uniquely determined by the doping amount of boron and also because the masks used for the implantation of boron into the two elements differ in thickness. Thus, the freedom of design and the allowance of production (in terms of process) are both improved because the bipolar element and the resistance element are allowed to acquire different functions.

The characteristics of the semiconductor device, therefore, can be easily controlled even when the bipolar element is miniaturized and they can be easily manufactured even when it is furnished with a MOS element. The semiconductor device which comprises a bipolar element enjoying high quality, high degree of integration, and high reliability and a bi-CMOS integrated circuit can be manufactured by this invention. Thus, the effect of this invention is veritably prominent.

The above and many other advantages and features and further objects of the present invention will become manifest to those versed in the art upon making reference to the following detailed description and accompanying drawings in which preferred embodiments incorporating the principles of the present invention are shown and cited by way of illustrative examples.

DETAILED DESCRIPTION OF THE PREFERRED EMBODIMENTS

Now, several preferred embodiments of the present invention will be described below with reference to the accompanying drawings.

Figure 2A:
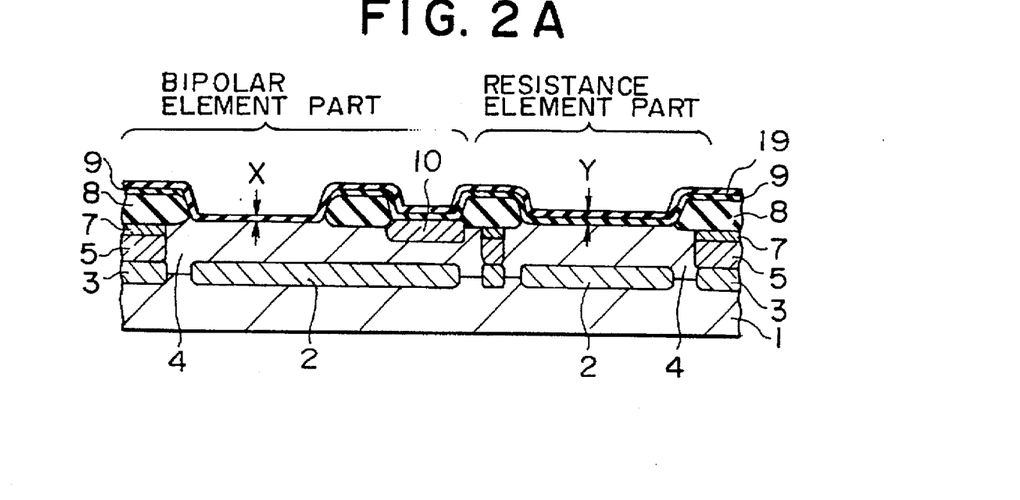
FIGS. 2A to 2C are cross sections of a semiconductor device illustrating sequentially the component steps of the manufacturing according to the first embodiment of the present invention.
Figure 2B:
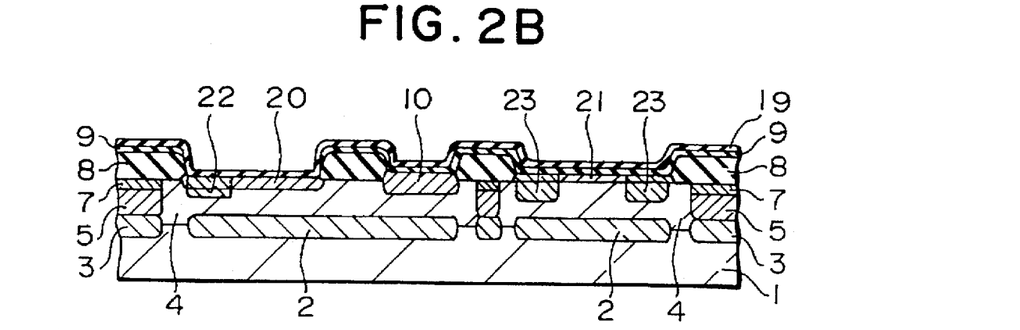
Figure 2C:
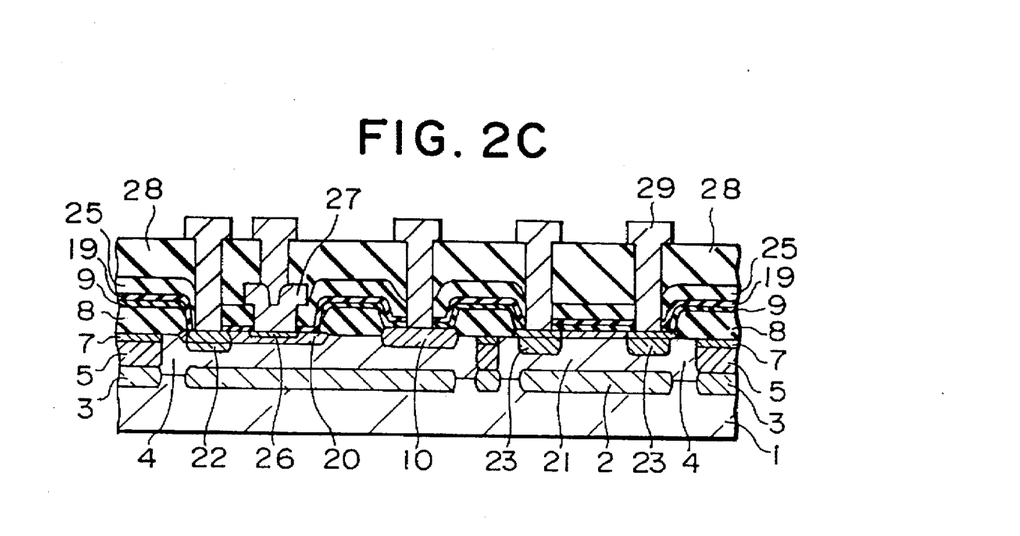

FIGS. 2A to 2C are cross sections showing sequentially the main component steps of the first preferred embodiment of the present invention. An N+ type embedded layer 2 and a P+ type embedded layer 3 are formed on a P type silicon substrate 1, an N type epitaxial layer 4 is grown thereon in a thickness in the approximate range of 1.0–3.0 μm, and a P type well 5, a P type channel stopper 7, and a field oxide film 8 are formed. Then, a first oxide film 9 is formed by oxidizing the resultant surface in a thickness of about 200 Å in an atmosphere of oxygen at a temperature in the approximate range of 900°–1000° C. and an N+ type collector diffusion layer 10 is formed by ion injecting phosphorus in an amount in the approximate range of $1-2\times10^{16}$ cm$^{-2}$ into the collector region of the bipolar element part. Up to this step, the present method is identical with the conventional method.

Then, the part of the first oxide film 9 corresponding to the base region of the bipolar element part, and excluding the collector region of the bipolar element part and the resistance element part, and the silicon surface of the N type epitaxial layer 4 are selectively chemically etched with such a gas as CF$_4$ to a depth in the range of 0.01–0.01 μm and the newly exposed surface is cleaned. Subsequently by oxidizing the total resultant surface in a depth of about 200 Å in an atmosphere of oxygen at a temperature in the approximate range of 900°–1000° C. to form a second oxide film 19, an oxide film (X) of about 200 Å is formed in the bipolar element part and an oxide film (Y) of about 300 Å in the resistance element part. This oxidation proceeds slowly in the resistance element part because the oxide film of about 200 Å is already present there [FIG. 2A].

Then, boron is doped by ion implantation in an amount in the approximate range of $5\times10^{12}-5\times10^{13}$ cm$^{-2}$ into the bipolar element part and the resistance element part to form a base diffusion layer 20 and a resistance diffusion layer 21 respectively. In this case, the resistance diffusion layer 21 is enabled to have a lower impurity concentration than the base diffusion layer 20 because the oxide films, X and Y, as masks for ion implantation have this relation X<Y in terms of thickness. Subsequently, boron is doped in an amount in the approximate range of $3-5\times10^{15}$ cm$^{-2}$ to form a graft base diffusion layer 22 and a P+ diffusion layer 23 [FIG. 2B].

Then, in accordance with the standard procedure, an insulating film 25 is grown to a thickness in the approximate range of 2000–3000 Å, an emitter diffusion layer 26 is formed by opening an emitter part, growing an emitter polycrystalline silicon to a thickness in the approximate range of 2000–3000 Å, doping by ion implantation arsenic in an amount in the approximate range of $1-2\times10^{16}$ cm$^{-2}$, and diffusing the introduced arsenic by a heat treatment, and an emitter electrode 27, an interlayer film 28, and an aluminum electrode 29 are formed to complete the semiconductor device aimed at [FIG. 2C].

FIGS. 3A to 3D are cross sections of a semiconductor device formed of a bi-CMOS circuit containing a MOS element, sequentially representing the main component steps of the second embodiment of this invention. This second embodiment differs from the first embodiment mentioned above in respect that the MOS element is provided on one and the same semiconductor device.

An N+ type embedded layer 2 and a P+ embedded layer 3 are severally formed on a P type silicon substrate 1 and an N type epitaxial layer 4 is grown thereon in a thickness in the approximate range of 1.0–3.0 μm. Then, P type wells 5 are formed each in the bipolar element part and the N type channel MOS element part, an N type well 6 is formed in the P type channel MOS element part, and a P type channel stopper 7 and a field oxide film 8 are formed. Subsequently, the resultant surface is oxidized in a thickness in the approximate range of 300–400 Å in an atmosphere of oxygen at a temperature in the approximate range of 900°–1000° C. to form a first oxide film 9, an N+ type collector diffusion layer 10 is formed by injecting phosphorus in an amount in the approximate range of $1-2\times10^{16}$ cm$^{-2}$ into the collector region of the bipolar element part, and the oxide film 9 is wholly removed [FIG. 3A].

Figure 3A:
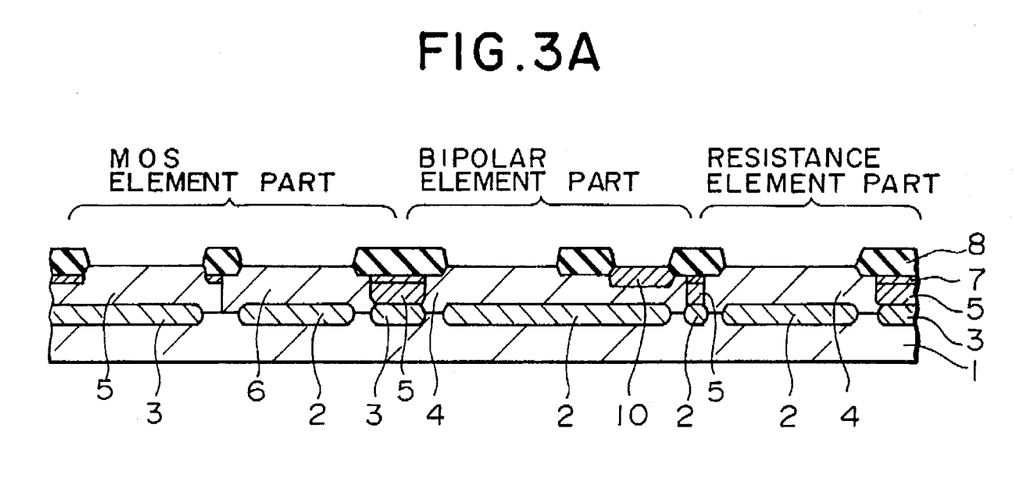
FIGS. 3A to 3D are cross sections of a semiconductor device illustrating sequentially the component steps of the manufacturing according to the second embodiment of the present invention.
Figure 3B:
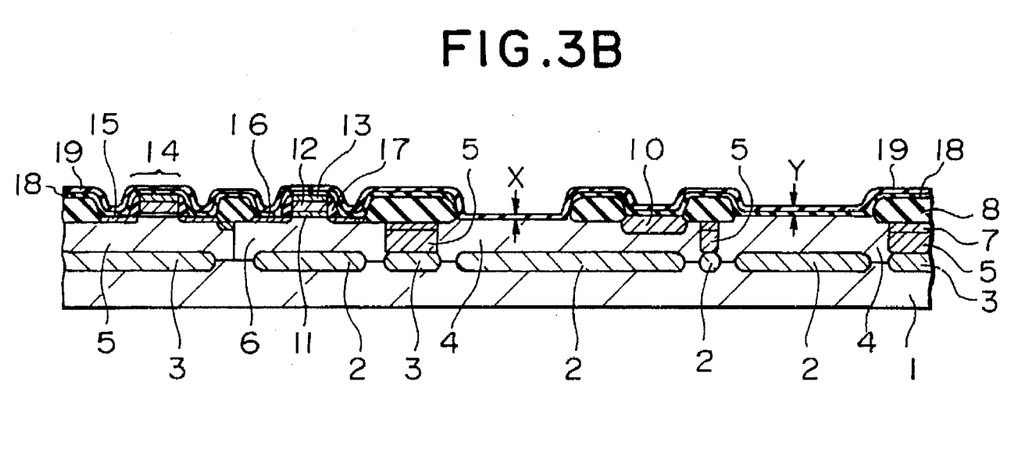
Figure 3C:
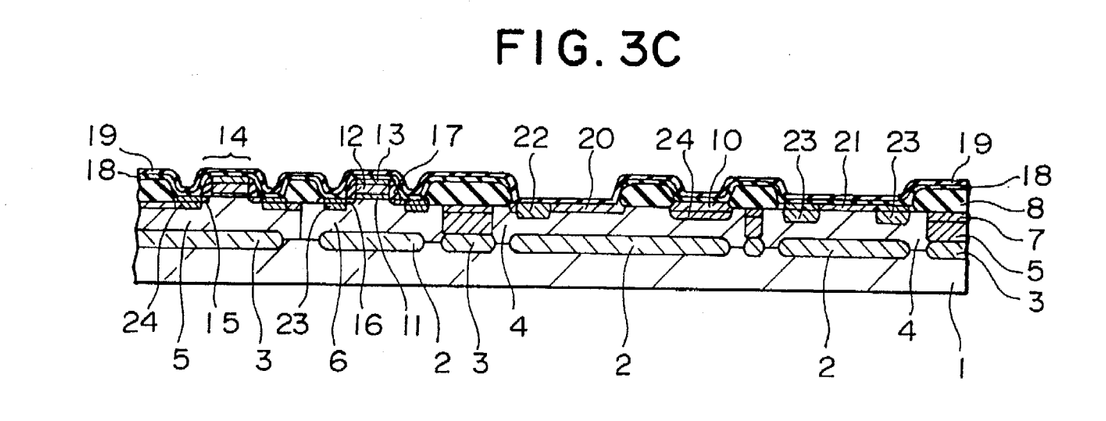

Then, for the purpose of forming a MOS element, the resultant surface is oxidized in an atmosphere of H$_2$–O$_2$ at a temperature in the approximate range of 750°–850° C. to form a gate oxide film 11 of a thickness in the approximate range of 100–150 Å, phosphorus is diffused by the use of a POCl$_3$ gas to form an N+ type polycrystalline silicon 12 of a thickness in the approximate range of 1500–2000 Å, a tungsten silicide (WSi) 13 is deposited thereon in a thickness in the approximate range of 1500–2000 Å by the sputtering method, and a gate electrode 14 is formed by the lithographic method. Then, an N type diffusion layer 15 of a relatively low concentration is formed by injecting phosphorus in an amount in the approximate range of $1-10\times10^{13}$ cm$^{-2}$ into the N type channel MOS element part with the gate electrode used as a mask and a P type diffusion layer 16 of a relatively low concentration is formed by doping boron by ion implantation in an amount in the approximate range of $1-10\times10^{13}$ cm$^{-2}$ into the P type channel MOS element part. Subsequently, an oxide film is formed in a thickness in the approximate range of 2000–3000 Å by the CVD method and a lateral wall oxide film 17 for the gate electrode 14 is formed by anisotropic etching. The silicon surface destined to form the base region of the bipolar element part is damaged by this etching and further polluted by the WSi from the gate electrode 14.

Then, a second oxide film 18 is formed in a thickness of about 200 Å in an atmosphere of oxygen at a temperature in the approximate range of 900°–1000° C. and the part of the second oxide film 18 corresponding to the base region part of the bipolar element part and excluding the collector region of the bipolar element part and the resistance element part and the damaged and polluted silicon surface of the N type epitaxial layer 4 are chemically etched selectively with a Gas such as $CF_4$ in a thickness in the approximate range of 0.01–0.02 μm and, at the same time, the newly exposed surfaces are cleaned. Then, by oxidizing the entire surface in a thickness of about 200 Å in an atmosphere of oxygen at a temperature in the approximate range of 900°–1000° C. for the purpose of forming a third oxide film 19, an oxide film of a thickness of about 200 Å is formed in the bipolar element part and an oxide film of a thickness of about 300 Å is formed in the resistance element part [FIG. 3B].

Then, a base diffusion layer 20 and a resistance diffusion layer 21 are formed by doping boron by ion-implantation respectively into the bipolar element part and the resistance element part at an energy of 10–15 KeV in an amount in the approximate range of $5 \times 10^{12}$–$5 \times 10^{13}$ $cm^{-2}$, a graft base diffusion layer 22 of the bipolar element and a P+ diffusion layer 23 destined to serve as a source and a drain of the P type channel MOS element part are formed by doping boron in an amount in the approximate range of $3$–$5 \times 10^{15}$ $cm^{-2}$, and an N+ diffusion layer 24 destined to serve as a source and a drain of the N type channel MOS element part is formed by injecting arsenic in an amount in the approximate range of $5$–$10 \times 10^{15}$ $cm^{-2}$. In this case, the N+ type collector diffusion layer 10 has arsenic doped therein preparatorily [FIG. 3C].

Figure 3D:
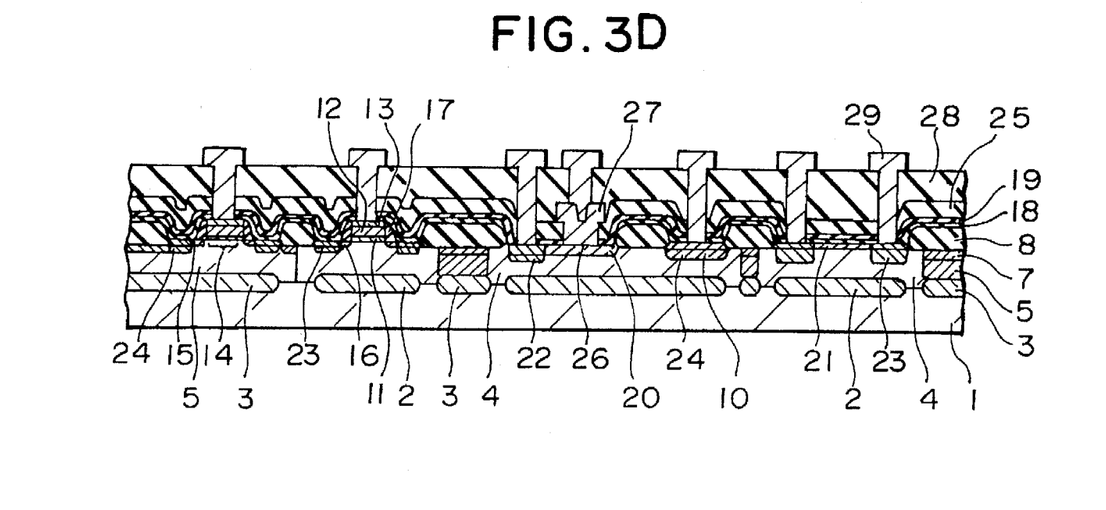

Then, in accordance with the standard procedure, an insulating film 25 is grown to a thickness in the approximate range of 2000–3000 Å, an emitter diffusion layer 26 is formed by opening an emitter part, growing an emitter polycrystalline silicon to a thickness in the approximate range of 2000–3000 Å, doping arsenic by ion implantation in an amount in the approximate range of $1$–$2 \times 10^{16}$ $cm^{-2}$, and diffusing the introduced arsenic by a heat treatment, and an emitter electrode 27, an interlayer film 28, and an aluminum electrode 29 are formed to complete the semiconductor device aimed at [FIG. 3D].

Figure 4A:
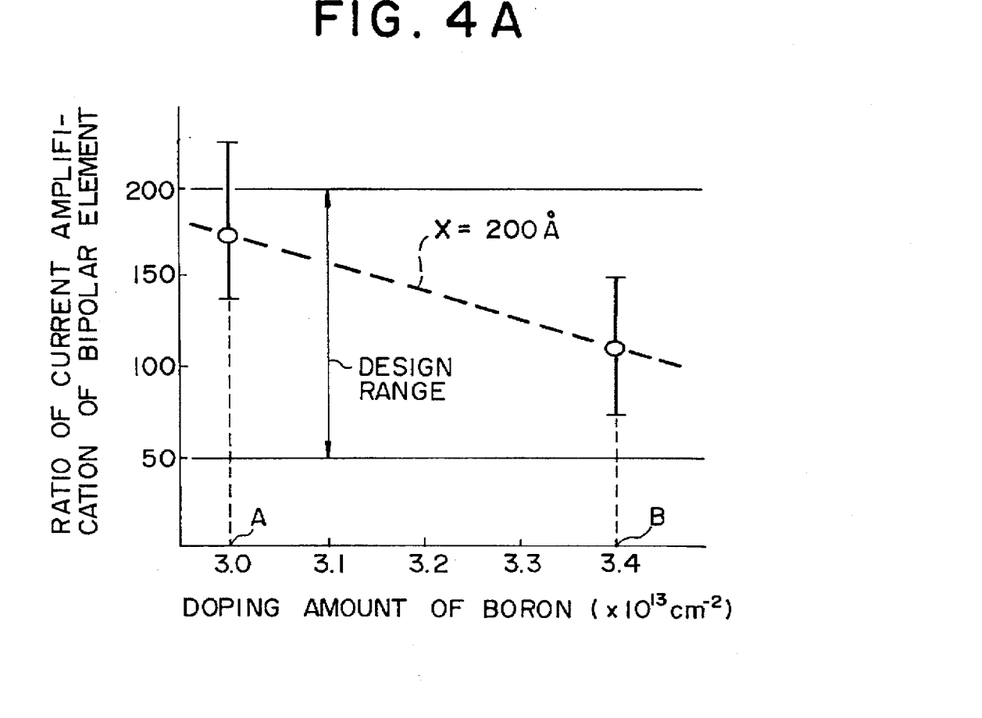
FIGS. 4A and 4B are graphs showing the relations between the current amplification ratio of the bipolar element and the resistance magnitude of the resistance element both formed by the first embodiment of the present invention and the doping amount of boron.
Figure 4B:
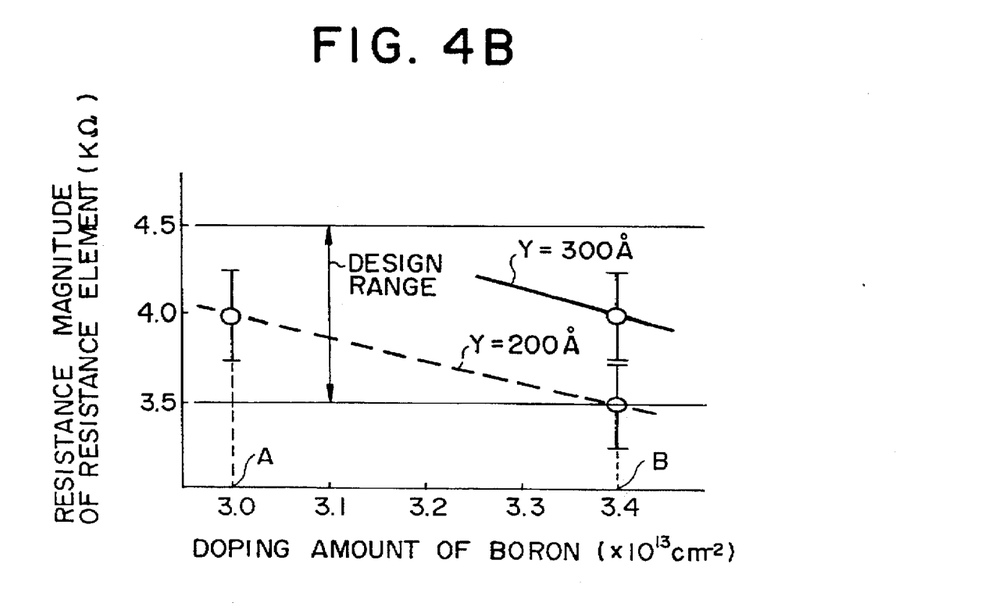

FIGS. 4A and 4B show the relations between the current amplification ratio of the bipolar element and the resistance magnitude of the resistance element both formed by the first embodiment of this invention and the doping amount of boron. It is clearly noted from FIGS. 4A and 4B that in the conventional technique, since the mask oxide film of the base region and the mask oxide film of the resistance region are identical in thickness (both 200 Å), the magnitude of resistance is obtained as designed and the ratio of current amplification is caused to exceed the upper limit of the design range when the doping amount of boron is set at the point A [FIG. 4A]. When the doping amount of boron is set at the point B, the current amplification ratio is obtained as designed and the magnitude of resistance is suffered to fall short of the lower limit of the design range [FIG. 4B].

In the present invention, since the oxide film of the base region and the oxide film of the resistance region are formed simultaneously in different thicknesses (X and Y as shown in FIG. 2A) by instantaneous ion implantation, the magnitude of resistance and the current amplification ratio can be obtained both at design levels by setting the doping amount of boron at the point B [FIGS. 4A and 4B].

In FIGS. 4A and 4B, O marked in each of the central portions of dispersion ranges of the current amplification ratio and the resistance magnitude indicates an average value.

What is claimed is:

1. A method of manufacturing a semiconductor device furnished on a silicon substrate, said device having component elements formed on the silicon substrate, said component elements including a bipolar element part having a base region and a collector region and a resistance element part formed of an impurity diffusion layer, comprising the steps of:

(a) forming a first oxide film on the entire surface of said silicon substrate and on the entire surface of said component elements,
    (b) selectively removing part of said first oxide film corresponding to said base region of said bipolar element part and, thereafter, a surface of said silicon substrate directly underlying said part of said first oxide film to form an exposed surface,
    (c) forming a second oxide film on said silicon substrate, said remaining first oxide film, and said component elements throughout the entire surface thereof thereby differentiating thickness of the oxide film formed on said base region and thickness of the oxide film formed on said resistance element part, and
    (d) selectively and simultaneously implanting ions into said bipolar element part and said resistance element part.

2. A method of manufacturing a semiconductor device furnished on a silicon substrate, said device having component elements formed on the silicon substrate, said component elements including a bipolar element part having a base region and a collector region and a resistance element part formed of an impurity diffusion layer, comprising the steps of:

(a) forming a first oxide film on the entire surface of said silicon substrate and on on the entire surface of said component elements,
    (b) ion implanting into said collector region of said bipolar element part through said first oxide film,
    (c) wholly removing said first oxide film,
    (d) forming a second oxide film on the entire surface of said silicon substrate and on the entire surface of said component elements,
    (e) selectively removing part of said second oxide film corresponding to said base region of said bipolar element and a surface of said silicon substrate directly underlying said second oxide film to form an exposed surface,
    (f) forming a third oxide layer on said silicon substrate, said remaining second oxide film and said component elements thereby differentiating thickness of the oxide film formed on said base region and thickness of the oxide film formed on said resistance element part, and
    (g) selectively and simultaneously implanting ions into said bipolar element part and said resistance element part.

3. A method of manufacturing a semiconductor device furnished on a silicon substrate, said device having component elements formed on the silicon substrate, said component elements including a bipolar element part having a base region and a collector region and a resistance element part formed on an impurity diffusion layer, comprising the steps of;

(a) forming a first oxide film on the entire surface of said silicon substrate and on the entire surface of said component elements, (b) implanting ions into said collector region of said bipolar element part through said first oxide film, (c) selectively removing part of said first oxide film corresponding to said base region of said bipolar element part and a surface of said silicon substrate directly underlying said first oxide film to form an exposed surface, (d) forming a second oxide film on said silicon substrate, said remaining first oxide film, and said component elements throughout the entire surface thereof thereby differentiating thickness of the oxide film formed on said base region and thickness of the oxide film formed on said resistance element part, and (e) implanting ions simultaneously into said bipolar element part and said resistance element part.

4. A method of manufacturing a semiconductor device furnished on a silicon substrate having component elements formed on the silicon substrate, said component elements including a bipolar element part having a collector region and a base region, a resistance element part formed on an impurity diffusion layer, and a MOS element part, comprising the steps of:

(a) forming a first oxide film on the entire surface of said silicon substrate and on the entire surface of said component elements, (b) implanting ions into said collector region of said bipolar element part through said first oxide film, (c) wholly removing said first oxide film, (d) sequentially forming a gate oxide film and a gate electrode on said MOS element part, (e) forming a second oxide film on the entire surface of said silicon substrate and on the entire surface of the component elements, (f) selectively removing part of said second oxide film corresponding to said base region of said bipolar element part and a surface of said silicon substrate directly underlying said second oxide film to form an exposed surface, (g) forming a third oxide film on said silicon substrate, said remaining second oxide film and said component elements throughout the entire surface thereof thereby differentiating thickness of the oxide film formed on said base region and thickness of the oxide film formed on said resistance element part, and (h) implanting ions selectively and simultaneously into said bipolar element part and said resistance element part.

* * * * *